(12) United States Patent
Volk

(10) Patent No.: US 6,191,662 B1
(45) Date of Patent: Feb. 20, 2001

(54) SELF-START CIRCUITS FOR LOW-POWER CLOCK OSCILLATORS

(75) Inventor: Andrew M. Volk, Granite Bay, CA (US)

(73) Assignee: Intel Corporation, Santa Clara, CA (US)

(*) Notice: Under 35 U.S.C. 154(b), the term of this patent shall be extended for 0 days.

(21) Appl. No.: 09/452,048

(22) Filed: Nov. 30, 1999

(51) Int. Cl.[7] .................. H03B 5/06; H03B 5/36
(52) U.S. Cl. .................. 331/158; 331/116 FE; 331/173; 327/142
(58) Field of Search .................. 331/116 K, 116 FE, 331/117 R, 117 FE, 117 D, 158, 180, 173

(56) References Cited

U.S. PATENT DOCUMENTS 5,557,243 * 9/1996 Ho .................. 331/158

* cited by examiner

Primary Examiner—David Mis
(74) Attorney, Agent, or Firm—Fish & Richardson P.C.

(57) ABSTRACT

A clock circuit includes an oscillator having a biasing node that causes the oscillator to enter a low-power state. The clock circuit also includes a kick-start circuit and a first mechanism. The kick-start circuit operates to provide an excitation to the oscillator, where the excitation enables the oscillator to start its oscillation. The first mechanism is configured to inhibit kick-start based on certain conditions, such as when the oscillator reaches a particular level capable of sustaining oscillation by itself or when the oscillator is already running.

21 Claims, 7 Drawing Sheets

SELF-START CIRCUITS FOR LOW-POWER CLOCK OSCILLATORS

BACKGROUND

The present invention relates to oscillators and more specifically, to self-start circuits for such oscillators.

The popularity of portable computers and hand-held devices has made it desirable for new computer products to operate with low power. To accommodate these low power requirements, computer chips often employ circuits that determine when to enter or exit the low-power state. FIG. 1 shows a typical system power supply 100 with a controller, such as an input/output (I/O) controller 102.

The I/O controller 102 also contains power state control logic 104 and a real-time clock (RTC) 106, as well as other peripheral devices (not shown). The controller 102 powers off (zero voltage) the I/O section of the chip during low-power states while the RTC 106 remains powered by either an auxiliary supply 118 or by a battery 118. The RTC 106 is in a different power "well" than the rest of the chip, which allows the RTC 106 to be powered separately. Also in this separate power well is the power state control logic 104 that controls the power state of the system power supply 100.

In most systems with low-power states, the power supply 100 has a main supply 120 and an auxiliary supply 118. The main supply 120 is enabled when the $\overline{\text{PwrEn}}$ input is active. The $\overline{\text{PwrEn}}$ input is controlled by the LP STATE signal 122 of the power state control logic 104. The controller 102 has internal timers and other inputs (not shown) that determine when to enter or exit the low-power state. VccAUX 118 is always active as long as the supply is plugged into the wall AC power in a desktop system or the main battery is present in a portable system.

The battery 114 provides back up to the auxiliary supply 118 if the supply is unplugged from the wall or the main battery is removed from the portable system. The auxiliary 118 and battery 114 supplies are "OR'ed" together by a diode network 108, 110. Since VccAUX 118 is always higher than the battery voltage while the supply 118 is on, it supplies current to VccRTC 124. If the auxiliary supply 118 fails, the battery 114 supplies the current to VccRTC 124. The resistor 112 in series with the diode 110 is a safety requirement for lithium batteries.

VccRTC 120 supplies power to the RTC 106 and to the power state control 104. Both blocks need to have power in order to keep system time and state during lower-power states when the main supply voltages 120 are shut down.

Resume reset (ResumeRST) 126 is an input that detects if the voltage level on the VccRTC 124 has failed because the battery 114 is dead or absent and VccAUX 118 is off. The RC delay on ResumeRST 126 is used to reset the state of the power state control logic 104, which allows the system to boot up. The ResumeRST signal 126 also enables a START signal to the RTC to ensure that the oscillator 116 is running.

When a battery is replaced or first inserted by a consumer or manufacturer, the oscillator may not self-start and thus needs "kicking." Since the consequences of the oscillator not starting, especially in the hands of the consumer, are expensive, it is advisable to take as many opportunities as possible to ensure that the oscillator is running.

SUMMARY

A clock circuit includes an oscillator having a biasing node that causes the oscillator to enter a low-power state. The clock circuit also includes a kick-start circuit and a first mechanism. The kick-start circuit operates to provide an excitation to the oscillator, where the excitation enables the oscillator to start its oscillation. The first mechanism is configured to inhibit kick-start based on certain conditions, such as when the oscillator reaches a particular level capable of sustaining oscillation by itself or when the oscillator is already running.

BRIEF DESCRIPTION OF THE DRAWINGS

Different aspects of the present invention will be described in reference to the accompanying drawings wherein.

DETAILED DESCRIPTION

The inventor recognized that it is desirable to have mechanisms that can intelligently kick-start an oscillator and also provide fast charging of a capacitor in the oscillator. The intelligent kick-start technique addresses several issues such as "kicking" the oscillator when it is already running or when the oscillator is capable of sustaining oscillation by itself. Kicking the oscillator when it is already running can produce effects that are harmful to the operating state of the oscillator.

Figure 1:
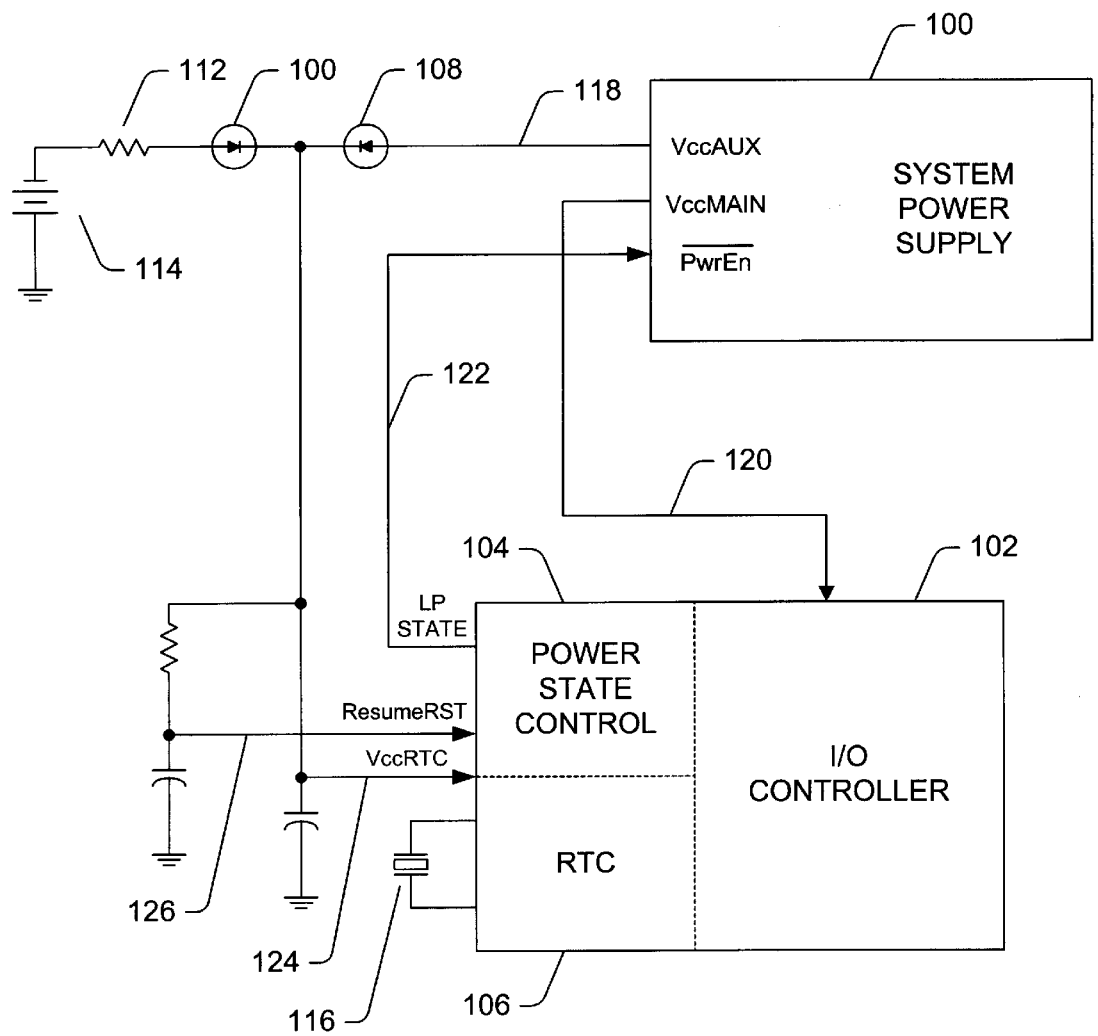
FIG. 1 shows a typical system power supply with a controller.
Figure 2A:
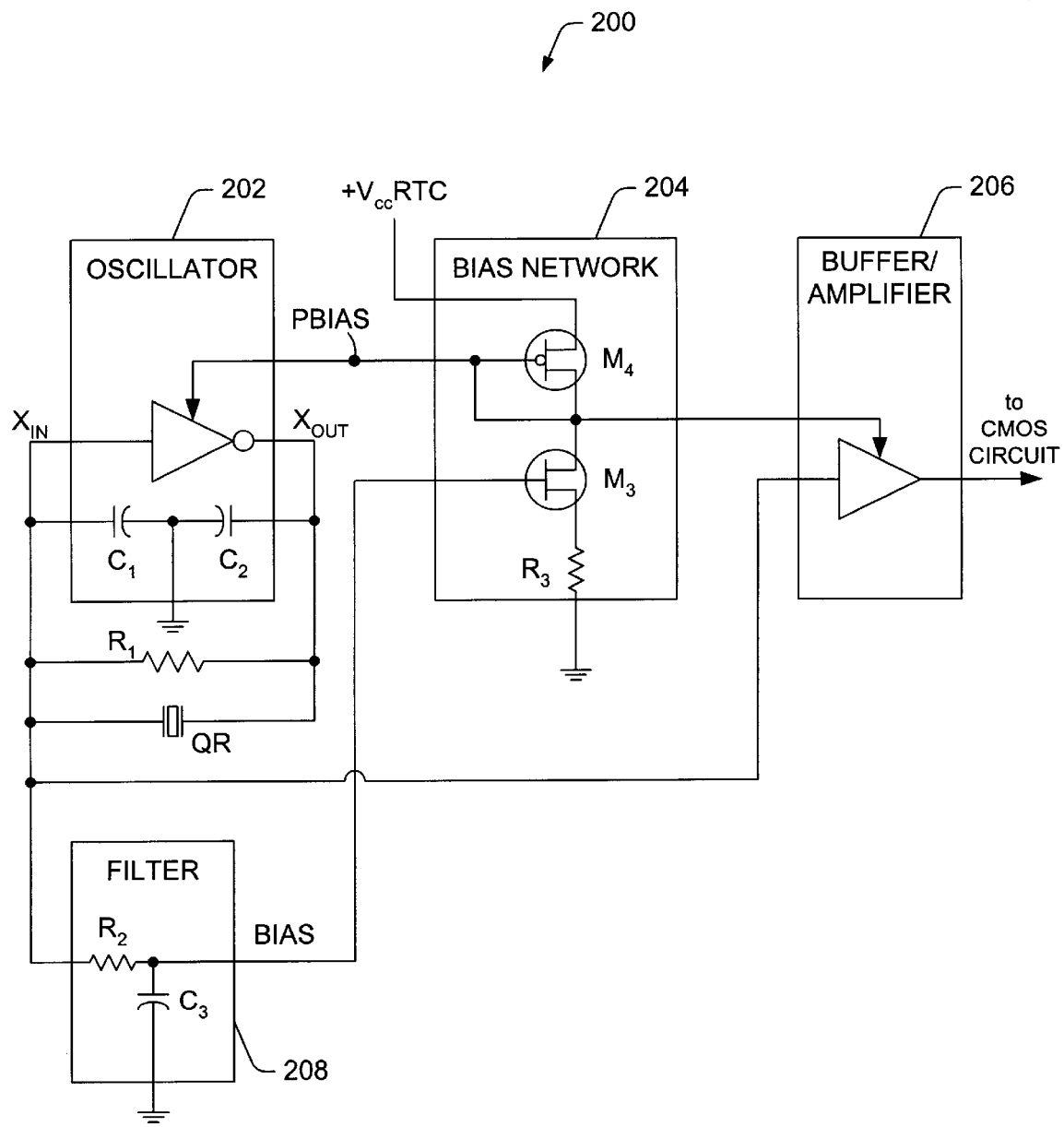
FIG. 2A is a block diagram of a self-biased low-power clock circuit according an embodiment of the present invention.

An example of a self-biased low-power clock circuit 200 according to an embodiment is shown in FIG. 2A. The figure is a simplified block diagram, which includes an oscillator 202, a low-pass filter 208, a bias network 204, and an output buffer 206. This clock circuit 200 is capable of biasing itself into a low-power state through a feedback mechanism.

The oscillator 202 is a current load inverter controlled by a bias network 204. A quartz crystal resonator QR enables oscillation at some specified frequency. A feedback resistor $R_1$ biases the inverter into its linear region. In one embodiment, resonator QR resonates at approximately 32.77 KHz and resistor $R_1$ is about 10 MΩ in value. Two capacitors $C_1$ and $C_2$ add necessary phase shift for oscillation. The capacitors also provide tuning of the quartz crystal to a precise frequency. In another embodiment, capacitors $C_1$ and $C_2$ are sized at about 18 pF.

The oscillator input $X_{IN}$ feeds back to a current biasing leg through a low-pass filter 208. The resistor $R_2$ is made large such that the loading effect on $X_{IN}$ is minimized while allowing the filter to capture the average voltage on $X_{IN}$. The filter 208 also provides a relatively long time constant with respect to the oscillator period. In a preferred embodiment, resistor $R_2$ and capacitor $C_3$ in the filter 208 are chosen to provide a time constant on the order of the settling time of the crystal QR. This choice increases the damping factor of the feedback loop. In one embodiment, resistor $R_2$ and capacitor $C_3$ are approximately 10 MΩ and 47 nF, respectively, in value.

Transistor $M_3$ and resistor $R_3$ in the bias network form a current source based on the average level of $X_{IN}$. The current in $M_3$ is mirrored to the control input of the oscillator 202 by a PBIAS signal. The signal is generated through diode-connected transistor $M_4$.

The oscillator circuit 202 is typically buffered to prevent variations in load and provide frequency stability to the clock circuit 200. The oscillator input $X_{IN}$ drives an output buffer 206 controlled by a PBIAS signal. The buffer 206 drives the CMOS output load and generates rail-to-rail CMOS voltage swings. The PBIAS signal causes current to be mirrored in the oscillator 100 and amplifier 106. Feedback of the $X_{IN}$ signal to $M_3$ in the bias network auto-regulates the level of current mirrored in the oscillator 100 and amplifier 106 to an optimally low-power state.

Figure 2B:
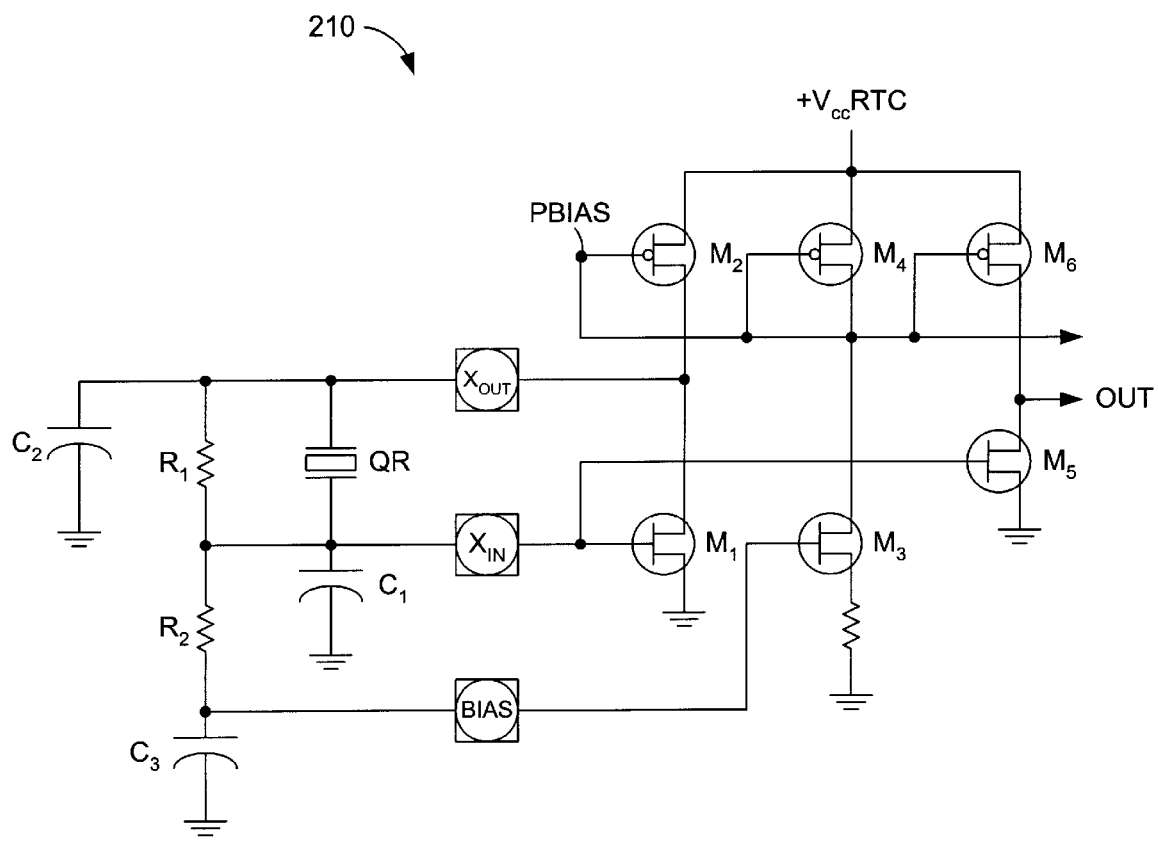
FIG. 2B is a schematic diagram of the low-power clock circuit.

FIG. 2B is a schematic diagram of the low-power clock circuit according an embodiment shown in FIG. 2A. The circuit 210 is similar to an oscillator circuit described in an article by Eric Vittoz, et al., "CMOS Integrated Circuits Based on Weak Inversion Operation," IEEE SSC, Vol. SC-12, No. 3, June 1977, pp. 224–231.

As described above, the low-power clock circuit 210 is capable of biasing itself into a low power state through its feedback mechanism.

However, feedback loop $M_1$ through $M_4$ has two stable operating states: a loop gain equal to one and a no-current state. In a no-current state, no current flows through either leg of the oscillator. When clock oscillators are powered up, some oscillators self-start as soon as power is applied. The leakage current from transistor $M_2$ drives the oscillator. However, this leakage current is relatively small compared to other leakage sources on a die or in a system. The current from these other sources can overwhelm the leakage current from transistor $M_2$. This situation can leave the oscillator 210 stuck in its non-oscillating state. Therefore, it is desirable to provide a start-up or kicker circuit, which will "kick" the clock circuit 210 out of its non-oscillating state at power up.

Figure 3:
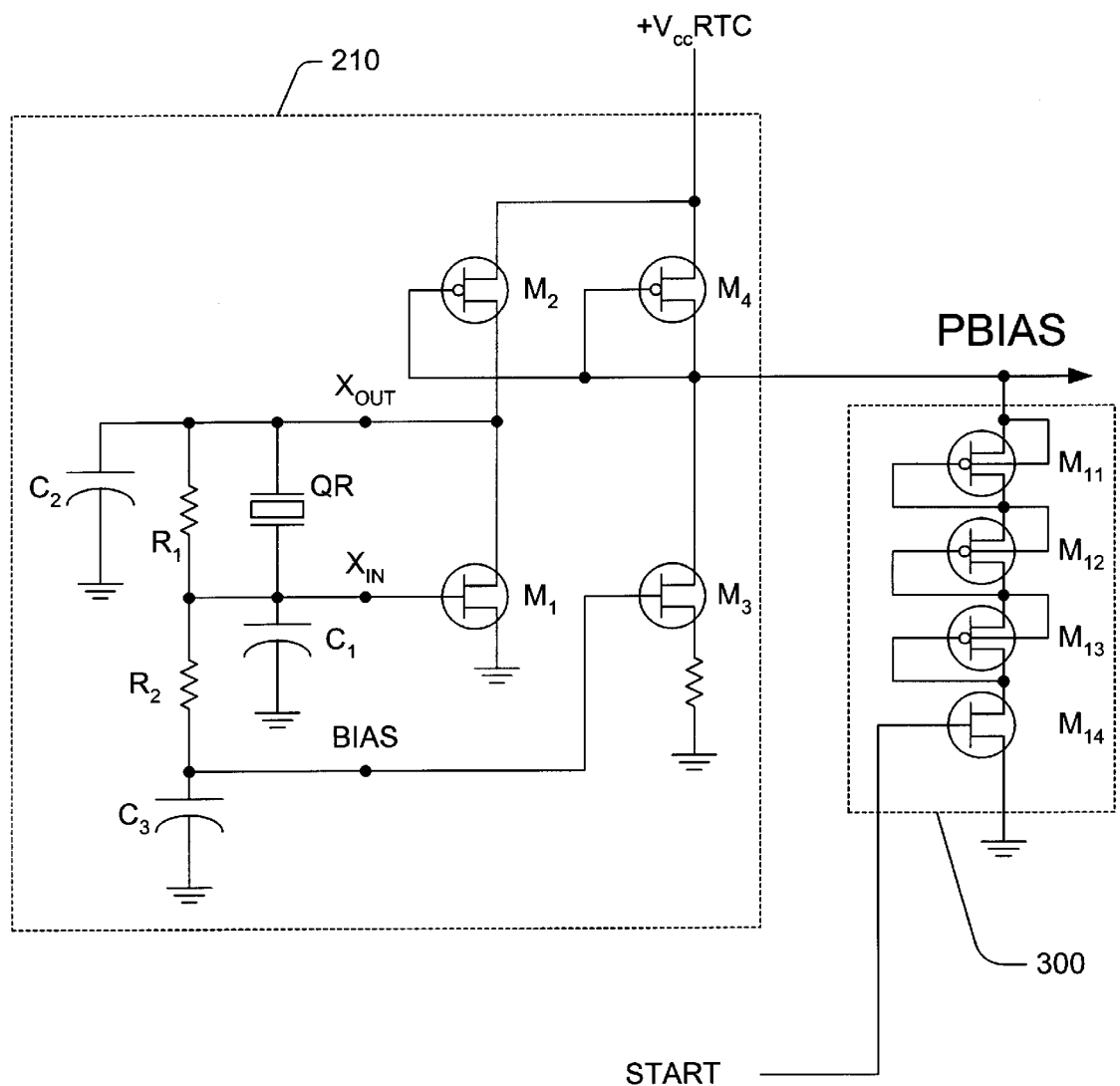
FIG. 3 is a schematic diagram of the low-power clock circuit coupled to a conventional kicker circuit.

A schematic diagram of the conventional kicker circuit 300 is shown in FIG. 3. When the power is applied, the START signal is asserted. Logic high at the START signal turns transistor $M_{14}$ on. This switches transistors $M_{11}$ through $M_{13}$ on. Thus, transistor $M_{14}$ enables a small current to be drawn to ground from PBIAS through transistor $M_{11}$ to $M_{13}$. This current excites current in transistor $M_2$, which flows through external components $R_1$ and $R_2$ to charge capacitor $C_3$ on the BIAS pin. Eventually, transistor $M_3$ conducts and supplies sufficient current to transistor $M_2$ and $M_1$ for oscillation to start. START signal is generally deactivated when clocks are detected in the core logic.

However, if not carefully controlled, the kicker circuit can provide enough current for the oscillator to start, independent of the voltage in the low pass filter or current through transistor $M_3$. The oscillator will start and may cause the logic that terminates the START signal to prematurely shut down. This may result in unreliable or prolonged startup. The low power clock circuit 210 and the kicker circuit 300, shown in FIG. 3, have no effective mechanism to inhibit kick-start if the oscillator is capable of sustaining oscillation by itself or if the oscillator is already running. Further, the capacitor $C_3$ in the low pass filter charges slowly. With a choice of capacitor value that provides a time constant on the order of the settling time of the crystal, the charge up time can be quite long.

If the kicker circuit 300 "kicks" the oscillator when it is already running, the circuit 300 adds current to the bias of the oscillator regardless of the state of the oscillator. In one embodiment, this over-biases oscillator such that the level of oscillation at $X_{IN}$ is not detected by the buffer/amplifier 106. The output of the oscillator stops for a period until the bias circuit settles to its normal state. This seriously disrupts the system operations that depend on this clock.

Figure 4:
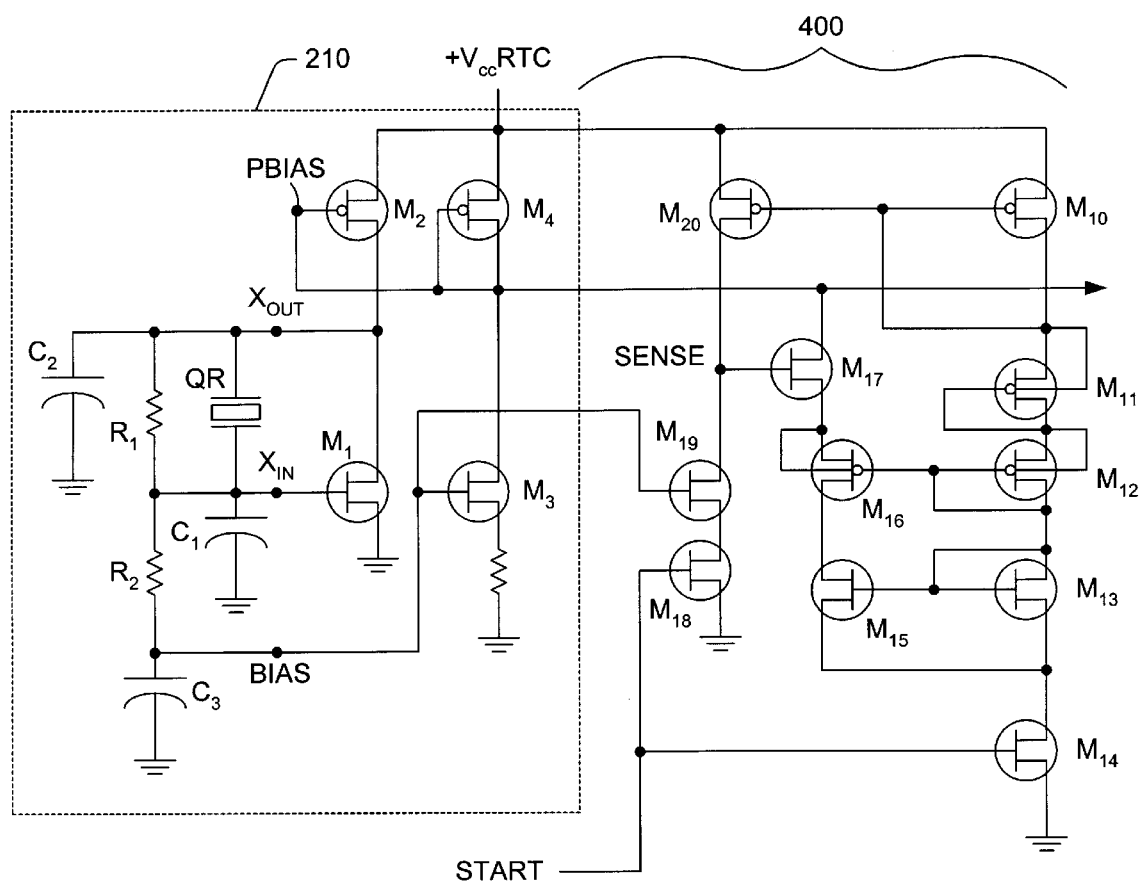
FIG. 4 is a schematic diagram of an enhanced kicker circuit according an embodiment of the present invention.

An embodiment of a kicker circuit 400 is shown in FIG. 4. The circuit 400 handles situations when the oscillator 210 is capable of sustaining oscillation by itself and when the oscillator 210 is already running.

The transistor chain $M_{11}$ to $M_{14}$ from the conventional kicker circuit 300 has been turned into an independent bias divider chain. The new kicker is a current mirror transistor pair $M_{15}$ and $M_{16}$.

The low-power clock circuit 210 can self-start and sustain the oscillation when there is sufficient current in transistor $M_2$ to overcome any other source of leakage current towards ground. This condition will occur when transistor $M_3$ is conducting current above approximately 10 nA. Since the current gain between transistors $M_2$ and $M_4$ is designed to be about 3, the current in transistor $M_2$ should be about 30 nA to get the oscillator started.

Although the current in transistor $M_3$ is difficult to detect, it can be "mirrored" and sensed by a mirror circuit. Transistors $M_{18}$ through $M_{20}$ form the mirror circuit that senses bias voltage at the gate terminal of transistor $M_3$ (the BIAS node). The current in transistor $M_{20}$ is "mirrored" off of transistor $M_{10}$, and therefore, the current is very weak. Transistor $M_{19}$ is appropriately sized to pull the SENSE node to logic low when the bias voltage on the BIAS node conducts at least 10 nA in transistor $M_3$. Transistor $M_{18}$ enables the mirror circuit when the START signal is asserted to logic high. When the voltage at the SENSE node is pulled low, the current in the kicker circuit 400 is shut off by transistor $M_7$.

The current in transistor $M_{16}$ mirrors the current in transistor $M_{12}$. This mirrored current drops some voltage across transistor $M_{15}$ and enables the voltage at the SENSE node to shut off the kicker 400 earlier in its low going swing. This provides the kicker circuit 400 with increased sensitivity to the voltage on the BIAS node.

The essential function of the mirror circuit is to monitor the rise of voltage on the BIAS node after power is applied and the START signal is asserted. The kicker circuit 400 is shut off as soon as transistor $M_3$ is conducting sufficient current to sustain oscillation build-up. It insures that no additional current is applied to the oscillator 210. After the voltage on the SENSE node transitions to logic low, the presence or removal of the START signal has no further effect on the oscillator 210. Further, if the oscillator 210 is already running when the START signal is applied, the voltage on the SENSE node will already be low and remain low. Transistor $M_{17}$ inhibits any effect from $M_{14}$ and $M_{18}$ activities on the kicker circuit 400 due to the START signal. Therefore, in this condition, the mirror circuit keeps the kicker 400 from affecting the oscillator 210 operations in any way.

The kicker circuit 400 is adjusted to not allow the oscillator to start until there is sufficient current in the bias network. When the current at the gate terminal of the transistor $M_3$ is sufficient to start the oscillator, the SENSE node voltage stops the kicker circuit 400.

Figure 5:
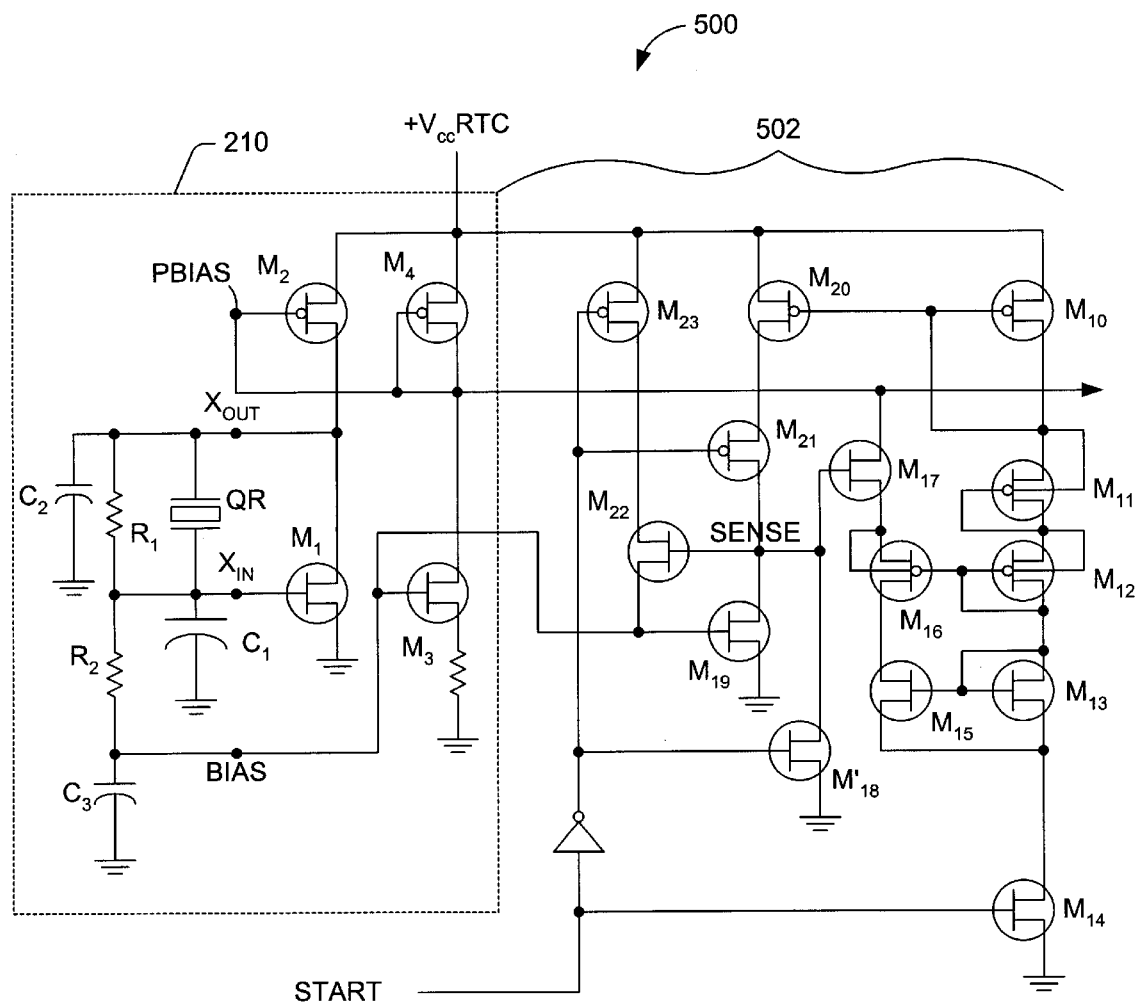
FIG. 5 is a schematic diagram of an enhanced kicker circuit according another embodiment of the present invention.

Another embodiment of a kicker circuit is shown in FIG. 5. The new oscillator circuit 500 addresses the problem of a slow charge rate of capacitor $C_3$ in the low pass filter. The circuit 500 provides means to start the oscillator 210 before the computer boot-up.

The consequence of the slow charge rate is the compromise of system functionality. In some systems, oscillators other than the RTC are also being enabled by the same signals that kicked the RTC oscillator. The system assumes that the RTC oscillator is running before the other system oscillators or other system activities begin. Therefore, if the RTC oscillator charges up slower than the other oscillators it could disrupt system functionality.

The voltage on the BIAS node is the result of a small current induced in transistor $M_2$ by the kicker 502 or by transistor $M_3$. Capacitor $C_3$ must charge through the external network of two resistors $R_1$ and $R_2$. Thus, the charge up time is quite long. The charge up time can be reduced by directly charging capacitor $C_3$ from within the oscillator circuit 500. The voltage on the SENSE node is again used to shut off the charging circuit 502 when the voltage at the BIAS node is sufficiently high for $M_3$ to conduct.

A combination of transistors $M_{22}$ and $M_{23}$ form the current source for an internal charging network 502. Transistor $M_{23}$ enables the charging when the START signal is asserted. Transistor $M_{22}$ allows charging to continue until the SENSE node is pulled low. The charging network 502 enables the charge time of bias capacitor $C_3$ to decrease from about 300 mS to about 20 to 30 $\mu$S.

Transistors $M_{21}$ and $M'_{13}$ enable the mirror circuit when the START signal is asserted. The transistors also minimize the current drawn when the START signal is inactive. When the START signal is inactive, transistor $M_{21}$ isolates the SENSE node from a power supply. Transistor $M'_{18}$ pulls the node down to ground.

Figure 6:
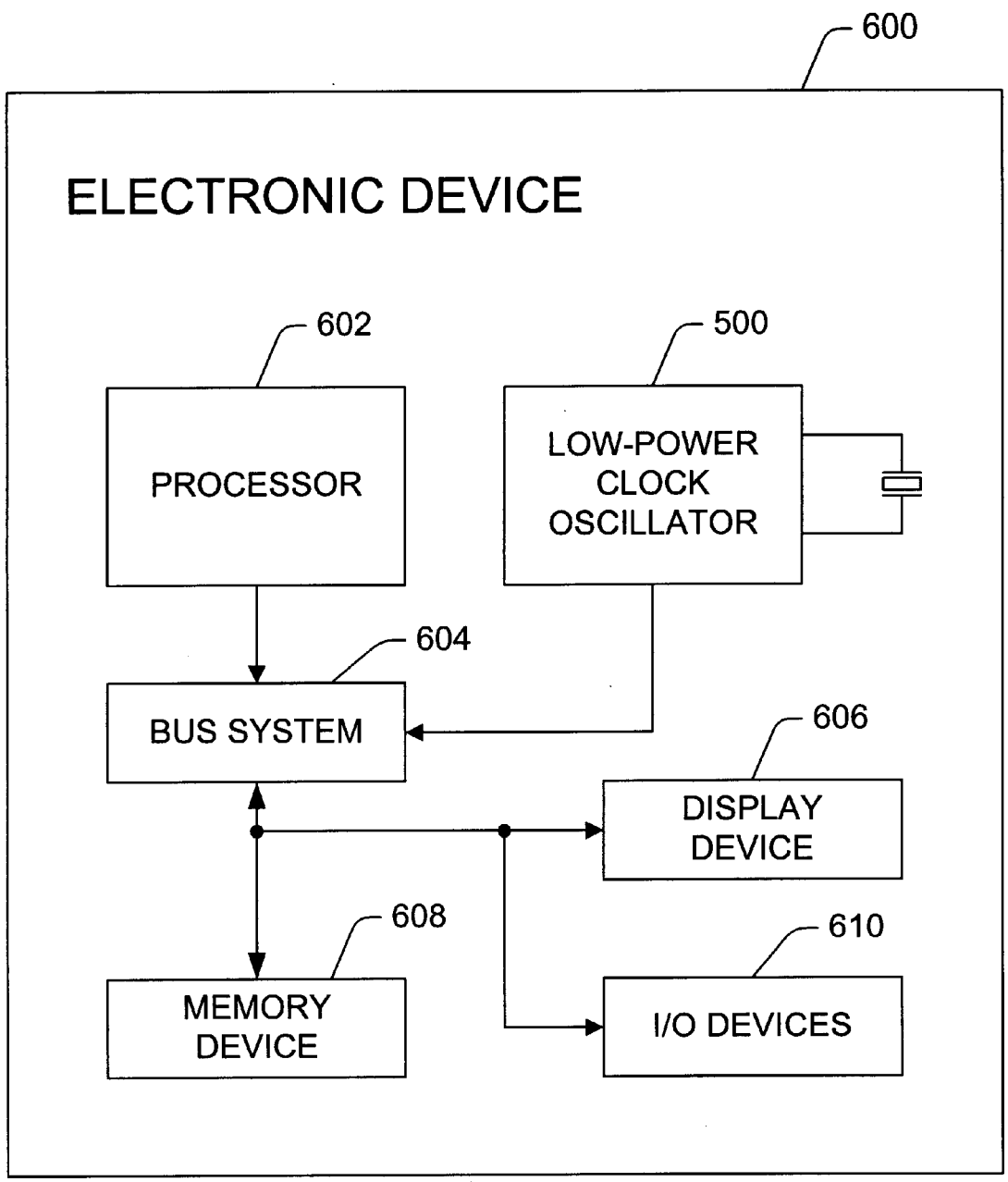
FIG. 6 is a simplified block diagram of an electronic device having a kicker circuit according an embodiment of the present invention.

FIG. 6 is a simplified block diagram of one embodiment of an electronic device 600, such as a laptop computer or a hand-held device. The device 600 includes a low-power clock oscillator circuit 500 that provides a stable clock signal and a self-biasing mechanism to transition the oscillator circuit 500 into a low-power state. The circuit 500 also provides fast self-charging and intelligent kick-start during power-up. The intelligent kick-start function includes electronics to inhibit kick-start if the oscillation is capable of sustaining oscillation by itself or if the oscillator is already running.

The electronic device 600 further includes a processor 602, a bus system 604, a memory device 608, and input/output (I/O) devices 610. The low-power clock oscillator circuit 500 keeps time and system state during periods when the rest of the system is power down or powered off.

Other embodiments are within the scope of the following claims. For example, a slight design modification to the oscillator circuit 500, described above, can be implemented to reduce the leakage current that may develop on the BIAS node. When a conducting transistor, such as transistor $M_{22}$, is connected to a node, a leakage current may develop to disturb the feedback path. The leakage current through transistor $M_{22}$ has two sources, diffusion area and sub-threshold channel conduction. The amount of diffusion connected to the BIAS node is small. Using a folded, common-source layout reduces this diffusion leakage. A long channel length transistor reduces channel leakage. The source terminal of transistor $M_{22}$ will be above its gate terminal when the transistor is turned off. Its drain terminal is isolated by $M_{23}$, which is also a long channel length device. This leaves transistor $M_{22}$ with a small back bias voltage. This voltage further raises its threshold and reduces leakage.

Examples of other embodiments include selection of channel types for the transistors shown in FIGS. 2A through 5. The transistor channel types shown in those figures are for illustrative purposes only. For example, transistor $M_2$ is illustrated as a p-channel transistor while transistor $M_1$ is shown as an n-channel transistor. However, the channel types of the two transistors can be interchanged without affecting the functionality of the circuit.

What is claimed is:

1. A circuit comprising:
   an oscillator having a biasing node that causes the oscillator to enter a relatively low-power state;
   a kick-start circuit providing an excitation to said oscillator, said excitation enabling said oscillator to start oscillation; and
   an inhibit circuit adapted to inhibit excitation to said oscillator.

2. The circuit of claim 1, wherein said inhibit circuit inhibits excitation to said oscillator if said oscillator reaches a particular operating level capable of sustaining oscillation without excitation.

3. The circuit of claim 1, wherein said inhibit circuit inhibits excitation to said oscillator if said oscillator is already operating.

4. The circuit of claim 1, wherein said inhibit circuit inhibits excitation to said oscillator if said oscillator reaches a particular operating level capable of sustaining oscillation without excitation or if said oscillator is already operating.

5. The circuit of claim 4, wherein said oscillator includes a feedback circuit and a bias network, said bias network adapted to provide a bias voltage in said feedback circuit.

6. The circuit of claim 5, wherein said inhibit circuit determines if said oscillator has reached said particular operating level or if said oscillator is already operating by monitoring a current flowing through said bias network.

7. The circuit of claim 5, wherein said oscillator further includes a buffer circuit coupled to input of said feedback circuit, said buffer circuit preventing variations in load and to provide frequency stability to said oscillator.

8. The circuit of claim 7, wherein said oscillator further includes a low-pass filter in said feedback circuit, said filter providing a relatively long time constant with respect to an oscillation period of said oscillator.

9. The circuit of claim 8, further comprising:
   a charge circuit adapted to provide fast charging of a capacitor in the low-pass filter.

10. The circuit of claim 1, further comprising:
    a receiving circuit adapted to receive a start signal indicating an application of power to said oscillator, said receiving circuit providing said kick-start circuit with an indication of said application of power.

11. The circuit of claim 10, wherein said kick-start circuit includes a plurality of transistors adapted to provide said excitation to the oscillator in response to said start signal.

12. A system comprising:
    an oscillator capable of biasing itself into a relatively low-power state;
    a kick-start circuit providing an excitation to said oscillator, said excitation enabling said oscillator to start its oscillation; and
    a start circuit adapted to start said oscillator before the system boots up.

13. The circuit of claim 12, wherein said start circuit enables said oscillator to start up before the system boots up by providing fast charging of a capacitor in said oscillator.

14. A circuit for a system comprising:

an oscillator having a bias network, a current load inverter controlled by said bias network, and a quartz resonator enabling oscillation, said oscillator capable of biasing itself into a relatively low-power state;

a kick-start circuit exciting said oscillator into oscillation; and an inhibit circuit adapted to inhibit kick-start if said oscillator reaches a particular operating level capable of sustaining oscillation without excitation or if said oscillator is already operating.

15. The circuit of claim 14, further comprising:

a charge circuit adapted to provide fast charging of a capacitor in said oscillator, said circuit adapted to provide excitation to said oscillator before the system boots up.

16. A circuit, comprising:

a kick-start circuit providing an excitation signal to the oscillator circuit, said signal enabling the oscillator circuit to start oscillation; and an inhibit circuit adapted to inhibit kick-start if the oscillator circuit reaches a particular operating level capable of sustaining oscillation without excitation or if the oscillator circuit is already operating.

17. The circuit of claim 16, further comprising:

a charge circuit adapted to provide fast charging of a capacitor in the oscillator circuit.

18. An electronic device, comprising:

processor;

a memory device adapted to store data;

input/output devices operating to provide input and/or output to said electronic device;

a bus coupled to said processor and said I/O device, said bus adapted to transport data to and from said processor and said I/O device; and a clock circuit providing time and system state during periods when rest of the electronic device is power down or powered off, said clock circuit having an oscillator capable of biasing itself into a relatively low-power state in the electronic device, said clock circuit operating to selectively inhibit kick-start.

19. The device of claim 18, wherein said clock circuit further includes an inhibit circuit adapted to inhibit kick-start if said oscillator reaches a particular operating level capable of sustaining oscillation without excitation.

20. The device of claim 18, wherein said clock circuit further includes an inhibit circuit adapted to inhibit kick-start if said oscillator is already operating.

21. The device of claim 18, wherein said clock circuit further includes a charge circuit adapted to provide fast charging of a capacitor in the oscillator, said charge circuit operating to start the oscillator before the electronic device boots up.

* * * * *